United States Patent [19]

Ahladas et al.

[11] Patent Number: 5,307,005
[45] Date of Patent: Apr. 26, 1994

[54] ZERO CURRENT SWITCHING REVERSE RECOVERY CIRCUIT

[75] Inventors: Steven J. Ahladas, Highland; Kevin R. Covi, Glenford, both of N.Y.

[73] Assignee: International Business Machines Corporation, Armonk, N.Y.

[21] Appl. No.: 996,323

[22] Filed: Dec. 23, 1992

[51] Int. Cl.$^5$ .................................. G05F 1/613
[52] U.S. Cl. .......................... 323/222; 323/282; 323/351; 361/18; 361/84
[58] Field of Search ............ 323/222, 223, 282, 290, 323/351; 361/18, 84

[56] References Cited

U.S. PATENT DOCUMENTS

| | | | |
|---|---|---|---|
| 4,688,158 | 8/1987 | Peterson et al. | 363/21 |
| 4,695,413 | 9/1987 | Ekelund et al. | 361/18 |
| 4,761,725 | 8/1988 | Henze | 363/46 |
| 4,853,837 | 8/1989 | Gulczynski | 363/80 |
| 5,066,900 | 11/1991 | Basset | 323/224 |
| 5,146,399 | 9/1992 | Gucyski | 323/222 |
| 5,164,656 | 11/1992 | Gucyski | 323/222 |
| 5,227,941 | 7/1993 | Rubin | 361/18 |

OTHER PUBLICATIONS

Ias Digest, Dec. 1992 V. Vlatkovic D. Borojevic, and F. C. Lee "A Zero-Voltage Switched, Three-Phase Boost PWM Rectifier With Power Factor Correction".

Primary Examiner—Jeffrey L. Sterrett
Attorney, Agent, or Firm—Duke W. Yee; Andrew J. Dillon

[57] ABSTRACT

Disclosed is a circuit for preventing damage to a controllable switching circuit as a result of a reverse recovery current originating from a rectifier circuit coupled to the controllable switching element during recovery of the rectifier circuit. The damage prevention circuit includes a reactive impedance circuit coupled in parallel with the rectifier circuit for controlling a reverse recovery current from the rectifier circuit during recovery of the rectifier circuit. A second controllable switching element is employed to direct the reverse recovery current to the reactive impedance circuit in response to recovery of the rectifier. The second controllable switch also directs the reverse recovery current from the reactive impedance circuit to a load, wherein the reverse recovery current may be safely diminished.

6 Claims, 3 Drawing Sheets

ZERO CURRENT SWITCHING REVERSE RECOVERY CIRCUIT

BACKGROUND OF THE INVENTION

1. Technical Field

The present invention generally relates to power supply circuits and in particular to voltage regulated power supplies for semiconductor based electronics. More specifically, the present invention provides a switching regulator with reduced reverse recovery currents.

2. Description of the Related Art

Power processing is an important feature in most electrical equipment. Differences in voltage and current requirements for various applications have resulted in the design of specific power converters to meet these requirements. Generally, power conversion involves the process of converting alternating current (AC) to direct current (DC) where converting the DC of one voltage level to the DC of another voltage level or both.

Linear regulators and switching regulators are the two basic varieties of power or voltage regulated converters. Although the switching regulator is not new concept, this type of regulator was not made practical until fast-switching high voltage transistors, low loss ferrite materials, and metallic glass materials became available. These developments allowed for practical and reliable construction of switching regulators.

Significant differences between linear and switching regulators include efficiency, size, weight, thermal requirements, response time, and noise characteristics. Switching regulators are generally preferred over linear regulators.

Switching regulators are commonly classified as one of three basic topologies: (1) buck; (2) boost; and (3) buck-boost. These switching regulators may be constructed from various arrangements of a switch, a diode, an inductor, and a capacitor.

FIGS. 1A–1C illustrate schematic diagrams of basic switching regulators well known in the prior art. FIG. 1A depicts a boost converter; FIG. 1B illustrates a buck converter; and FIG. 1C depicts a buck-boost converter. All three of these switching regulators are well known in the prior art. Each of these regulators has a switch S1, inductor L1, diode D1, and capacitor C1. A load 10 is coupled in parallel with the capacitor C1.

Referring again to FIG. 1A, inductor L1, diode D1, and capacitor C1 are connected in series to supply voltage Vs in the boost converter. Diode D1 serves as the rectifier in this circuit. Load 10 is connected in parallel with capacitor C1. Point P is connected to the negative pole of supply voltage source Vs by switching element S1. Switching element S1 preferably is a transistor, such as a metal oxide semiconductor field effect transistor (MOSFET). By switching the MOSFET into alternating on and off states, the voltage across capacitor C1 and load 10 will be higher than supply voltage Vs. As a result, this switching regulator functions as a voltage increasing circuit.

Since capacitor C1 will be positively charged on the side or plate facing diode D1, diode D1 will be biased in the reversed direction each time switching element S1 is in the on-state. Before the diode D1 blocks in the reverse direction, a charge stored during its "on" state in the forward direction gives rise to a reverse recovery current during the diode reverse recovery time. "Reverse recovery time" is the time that it takes to turn off a forward-biased diode through dissipating the stored charge in the diode.

More specifically, a boost converter typically involves the output rectifier being turned off directly by the MOSFET switch without a limiting impedance in series with the MOSFET switch. As the MOSFET switch turns on, the inductor acts as a current source and the MOSFET switch shifts the current from the output rectifier through the MOSFET switch itself. As the current in the rectifier drops to zero, the rectifier does not immediately shut off because charge is stored in the rectifier device. During the reverse recovery time, the rectifier actually conducts in the reverse direction, resulting in a reverse recovery current. In a boost topology, the output rectifier is connected directly to an output capacitor. Consequently, when the MOSFET switch turns on and reverse recovers the rectifier, the MOSFET switch is effectively turning on into the capacitor. In such situations the MOSFET switch may be subjected to large currents, thus possibly damaging the MOSFET switch.

The amount of reverse recovery current that may occur during recovery of the rectifier may be limited by: (1) the stored charge in the rectifier, which is dependent on device characteristics and operating current and (2) the potential reverse recovery current, which is dependent on switch turn on rate, output voltage, and output impedance. Depending on the switching regulator requirement, reverse recovery current problems may be solved by employing a fast rectifier and a switch capable of absorbing the reverse recovery current. This solution works for low voltage applications, such as applications which employ less than fifty volts.

Many applications however may require switching regulators with a high voltage output, such as three-hundred-ninety volts. In such a situation, reverse recovery currents are still a problem that must be dealt with in constructing efficient and reliable switching regulators.

Therefore, it would be desirable to have a switching regulator in which a reverse recovery current may be reduced or eliminated to avoid damaging the switch.

SUMMARY OF THE INVENTION

It is therefore one object of the present invention to provide an improved power supply circuit.

It is another object of the present invention to provide an improved voltage regulated power supply for semiconductor based electronics.

It is yet another object of the present invention to provide a switching regulator with reduced reverse recovery currents.

It is still another object of the present invention to provide a zero voltage switching regulator.

The foregoing objects are achieved as is now described. A circuit is provided for preventing damage to a controllable switching circuit as a result of a reverse recovery current originating from a rectifier circuit coupled to the controllable switching element during recovery of the rectifier circuit. The damage prevention circuit has a reactive impedance circuit coupled in parallel with the rectifier circuit for controlling a reverse recovery current from the rectifier circuit during recovery of the rectifier circuit. A second controllable switching element is employed in the circuit to direct the reverse recovery current to the reactive impedance circuit in response to recovery of the rectifier. The second controllable switch also directs the reverse recovery current from the reactive impedance circuit to a load, wherein the reverse recovery current may be safely diminished.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1A:
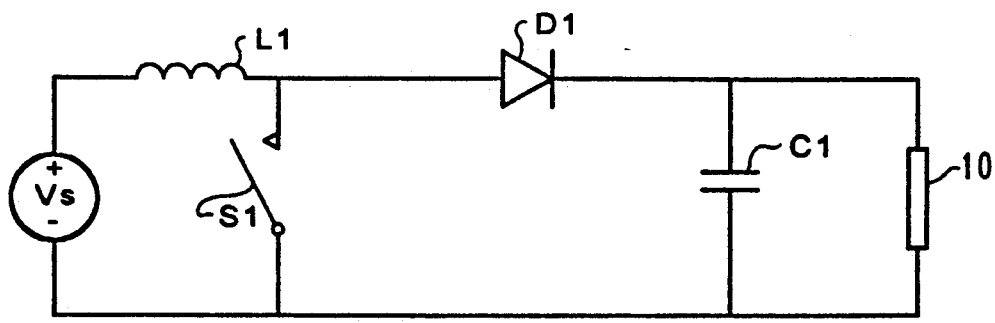
FIG. 1A depicts a schematic diagram of prior art boost converter.
Figure 1B:
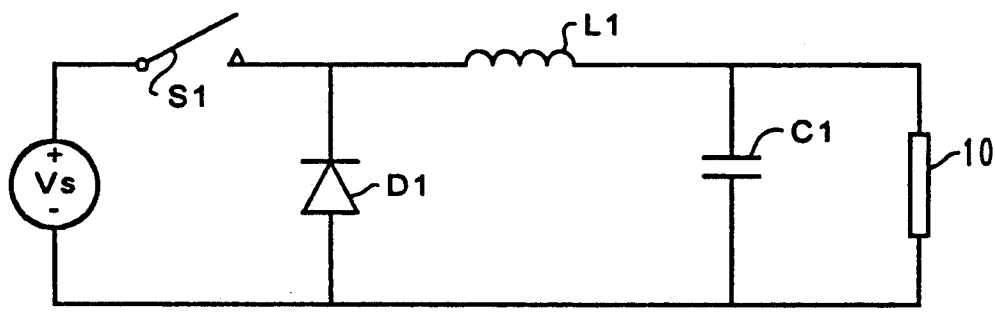
FIG. 1B depicts schematic diagram of a prior art buck converter.
Figure 1C:
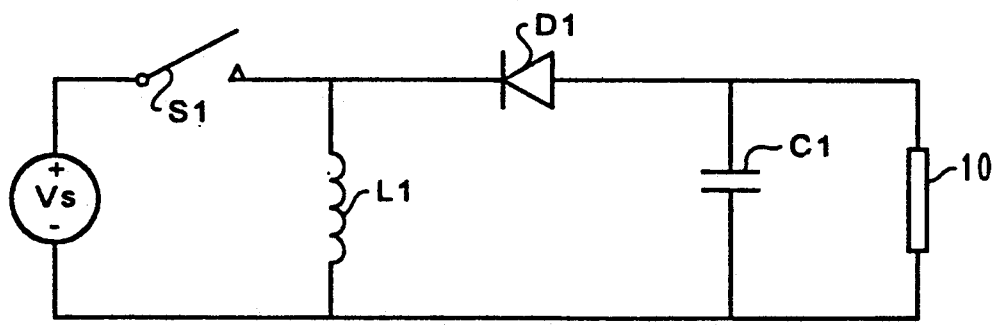
FIG. 1C depicts a schematic diagram of a prior art buck-boost converter.
Figure 2A:
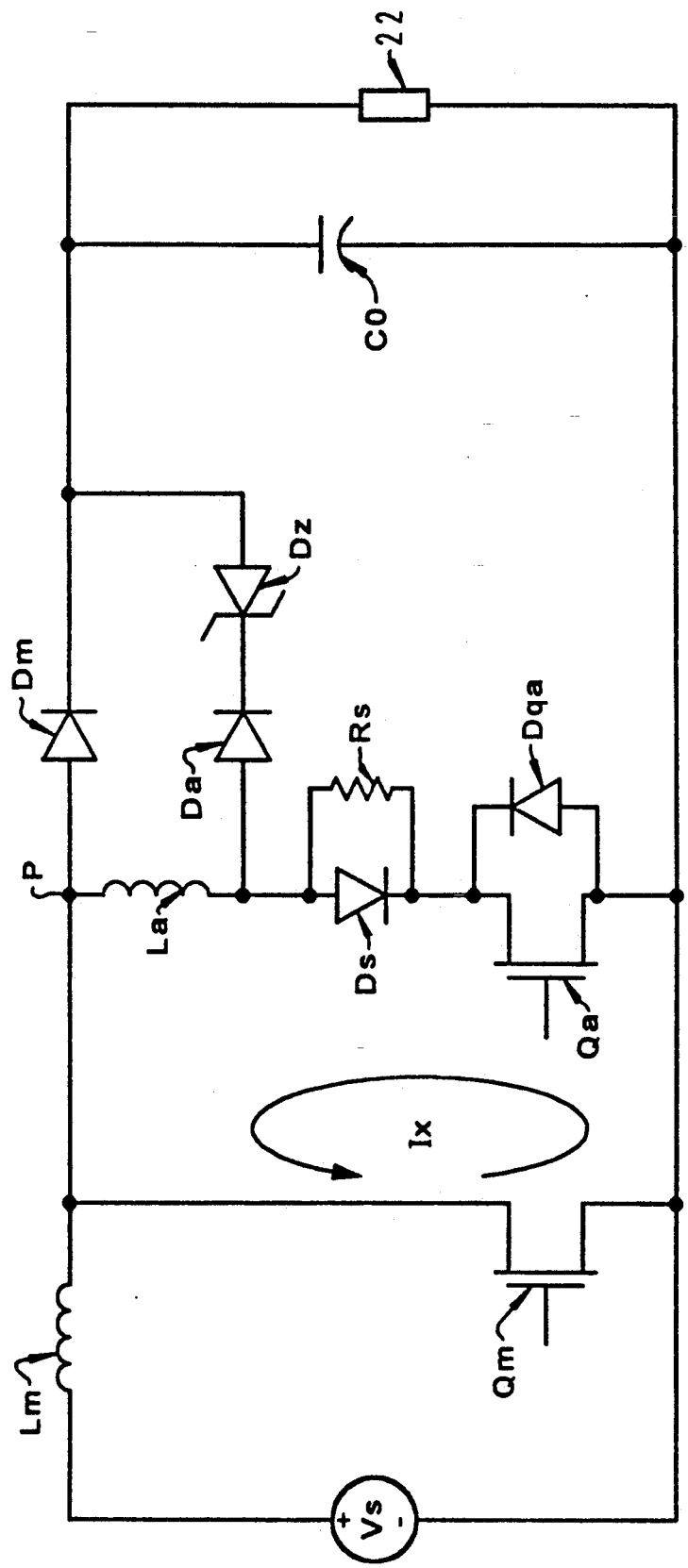
FIG. 2A is a schematic diagram of a boost switching regulator circuit accordance with a preferred embodiment of the present invention.

With reference now to the figures and in particular with reference to FIG. 2A, a schematic diagram illustrating a boost switching regulator is depicted in accordance with a preferred embodiment of the present invention. Inductor Lm, diode Dm and capacitor CO are coupled in series. Diode Dm is employed as a rectifier in accordance with a preferred embodiment of the present invention. Voltage source Vs provides power to this circuit and is coupled to one end of inductor Lm.

MOSFET switch Qm is coupled to point P, located between inductor Lm and diode Dm, and is the preferred type of controllable switch in accordance with a preferred embodiment of the present invention. Those skilled in the art will realize that other types of controllable switches may be utilized in accordance with a preferred embodiment of the present invention.

The present invention provides a reverse recovery circuit as an active circuit that causes the current through the output rectifier (diode Dm) to be recovered through an impedance. By making the impedance reactive (i.e., an inductor) the recovery current may eventually be channeled to the load. After the rectifier is completely recovered, the switching current may be channeled through main power switch, (Qm).

Inductor La, diode Da, and zener diode Dz are coupled in series. These components are coupled in parallel with diode Dm. Diode Ds and MOSFET Qa are coupled together in series with inductor Lm; resistor Rs is coupled in parallel with diode Ds. These components form the reverse recovery circuit of the present invention.

In the reverse recovery circuit, MOSFET switch Qa is utilized to channel reverse recovery currents through inductor La. Diode Da and zener diode Dz channel current flowing from inductor La away from MOSFET switch Qa, when MOSFET switch Qa turns off. The current from inductor La is channeled to load 22 by diode Da and zener diode Dz. Without diode Da and diode Dz, current from inductor La would continue to flow into MOSFET switch Qa and possibly damage the switch.

Both MOSFET switch Qm and MOSFET switch Qa may be controlled by a gate drive signal to the gate of each MOSFET switch utilizing timing controllers and delays well known to those skilled in the art.

The following is a listing of values for components utilized to produce a 360 volt output, Vo, from a 200 volt input: inductor Lm=800 $\mu$H, inductor La=22 $\mu$H, resistor Rs=40 $\Omega$ diode Dz=28 volts in accordance with a preferred embodiment of the present invention. Diodes Da and Dm should be "fast" diodes as are well known to those skilled in the art. The reverse recovery time for all of the diodes should be 100 nano seconds or less. Capacitor Co may vary depending on the application. The switching frequency of the MOSFET switches should be 50 kHz. In accordance with a preferred embodiment of the present invention, the gate of MOSFET switch Qa should be high for only 1 $\mu$S, which is equal to time t1 and time t2. Time t2 is the time during which both MOSFET switch Qa and MOSFET switch Qm are both on. Time t1 should be greater than $(La/Vo)* I_{Lm(max)}$, where La is the value of inductor La, Vo is the output voltages and $I_{Lm(max)}$ is the maximum current through inductor Lm in accordance with a preferred embodiment of the present invention.

Those skilled in the art will realize that the component values specified above may vary depending on the application. Additionally, although the illustrated embodiment depicts a DC power supply with a DC output, a preferred embodiment of the present invention also may be implemented as an AC/DC converter, a DC/DC converter, or a DC/AC converter.

Figure 2B:
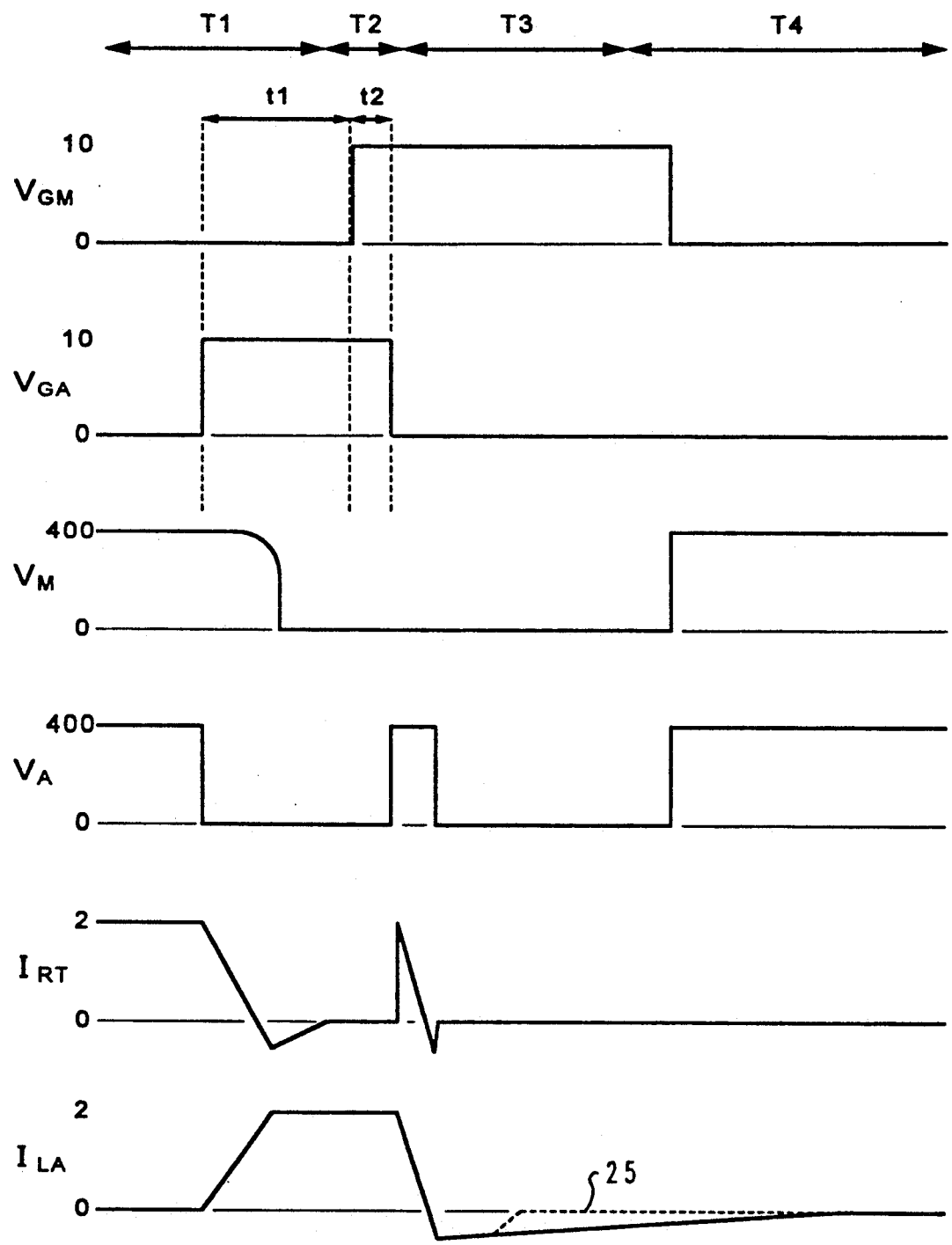
FIG. 2B depicts a waveform timing diagram for the boost regulator circuit depicted in FIG. 2A.

Referring now to FIG. 2B, a waveform timing diagram for the boost switching regulator circuit of FIG. 2A is depicted. The waveforms are subdivided into four time periods, T1-T4, which form the switching cycle of the boost switching regulator circuit in accordance with a preferred embodiment of the present invention. $V_{GM}$ is the voltage applied to the gate of MOSFET switch Dm, while $V_{GA}$ illustrates the voltage applied to the gate of MOSFET switch Da. When $V_{GM}$ is high at the gate of MOSFET switch, Qm is turned "on". Similarly, when voltage $V_{GA}$ is high at the gate of MOSFET switch, Qa is turned "on". A low voltage at the gate of a MOSFET switch results in the switch being turned "off".

Voltages $V_M$ and $V_A$ depict the voltage across MOSFET switch Qm and MOSFET switch Qa respectively. Current $I_{RT}$ is the current flowing though diode Dz and diode Da plus the reverse recovery current originating from diode Dm during the recovery of diode Dm when the diode is turned off.

During time period T1, diode Dm recovers and a reverse recovery current flows through inductor La. During this time period, MOSFET switch Qm is turned off while MOSFET switch Qa is turned on. In other words, current conducts through MOSFET switch Qa, but not through MOSFET switch Qm during period T1. Before diode Dm recovers, the reverse recovery current through diode Dm is channeled or switched into inductor La. This switching of the reverse recovery current into inductor La aids in minimizing minority carriers in diode Dm because the reverse recovery current is ramped off at a slow rate.

During time period T2, MOSFET switch Qm turns on and MOSFET switch Qa turns off shortly thereafter. More specifically, MOSFET switch Qa turns off after time t2 measured from the time MOSFET switch Qm turns on.

At the time MOSFET switch Qm turns on, MOSFET switch Qa has already caused diode Dm to recover through inductor La. Prior to MOSFET switch Qm turning on, no reverse recovery current is flowing from diode Dm to MOSFET switch Qm. Current is, however, flowing from inductor Lm to inductor La and through MOSFET switch Qa.

Consequently, MOSFET switch Qm turns on in both a zero voltage and zero current state. In other words, no voltage is present across MOSFET switch Qm as may be seen with reference to $V_M$ in FIG. 2B. As a result, no loss in power occurs when MOSFET switch Qm is turned on. After MOSFET switch Qm is turned on, current continues to flow through the path established by inductors Lm and La. No current flows through MOSFET switch Qm until MOSFET switch Qa is turned off. In this fashion, possible damage to MOSFET switch Qm from reverse recovery currents is eliminated. Additionally, zero voltage switching (ZVS) and zero current switching (ZCS) at MOSFET switch Qm may be achieved. ZVS occurs when no voltage is present across MOSFET switch Qm during switching; ZCS occurs when no current flows through MOSFET switch Qm during switching.

As MOSFET switch Qa is turned off, the current in inductor La is shunted through diode Da and zener Dz to the output at load 32. The forward current through diode Da and zener diode Dz causes the drain of MOSFET switch Qa to be clamped to the output voltage plus the zener value of zener diode Dz. Since MOSFET switch Qm is on, a voltage develops across inductor La and the core inductor La that will require resetting.

At time period T3, MOSFET switch Qa has just been turned off and MOSFET switch Qm is in the on state. When MOSFET switch Qa turns off, the core of inductor La is reset by clamping to the voltage at capacitor CO. The current through inductor La actually overshoots a current of zero amps because of the reverse recovery time of diode Da. Once this reverse current, depicted by current Ix in FIG. 2A, is set up in inductor La, the current freewheels through the body diode Dqa in MOSFET switch Qa and the drain of MOSFET switch Qm since MOSFET switch Qm is on. It is desirable to minimize the amount of freewheel current because this energy must ultimately be dissipated in order to reset inductor La.

Next, at time period T4, MOSFET switch Qm is turned off and MOSFET switch Qa is still in the off state as may be seen with reference to $V_{Gm}$ and $V_{GA}$ in FIG. 2B. The freewheel current through body diode Dqa in MOSFET switch Qa may still be present when MOSFET switch Qm shuts off. When MOSFET switch Qm turns off, this causes a reverse recovery current spike through body diode Dqa. Current travels through diode Dm from inductor Lm. Again, some current freewheels from inductor La into the load via diode Da and zener diode Dz. Some current flows across body diode Dqa as it recovers from current originating from diode Dm.

Current Ix, the reverse recovery current from body diode Da, flows through the switching regulator during time period T3 in accordance with a preferred embodiment of the present invention. Diode Ds and resistor Rs are employed to reduce the flow of current through inductor La as illustrated by the long tail of current $I_{LA}$ in FIG. 2B. Resistors Rs is utilized to reduce current Ix as illustrated in FIG. 2B, resulting in by short tail 25. Diode Ds allows non-parasitic currents to shunt to resistor Rs.

The present invention has the advantage of allowing for the construction of reliable high voltage switching regulators since reverse recovery currents may be diminished.

An added benefit of utilizing a reverse recovery circuit, in accordance with a preferred embodiment of the present invention, is that ZVS and ZCS the main MOSFET switch is made possible. Normally, power is lost in a MOSFET switch during the transition stage since the voltage across the switch is not equal to zero. Utilizing the reverse recovery circuit of the present invention results in the voltage across the switch being equal to zero. As a result, no switching power losses occur.

Although the reverse recovery circuit in the depicted embodiment is implemented in a boost switching regulator, those skilled in the art will realize that the reverse recovery circuit of the present invention may be implemented in other switching regulators, such as, for example a buck switching regulator or a buck-boost switching regulator.

Additionally, the illustrated embodiment depicts a single diode as a rectifier. Those skilled in the art will realize that other numbers and arrangements of rectifiers, other than a single diode, may be employed in accordance with a preferred embodiment of the present invention.

While the invention has been particularly shown and described with reference to a preferred embodiment, it will be understood by those skilled in the art that various changes in form and detail may be made therein without departing from the spirit and scope of the invention.

What is claimed is:

1. A switching regulator comprising:
   a rectifier;
   a capacitive element coupled in series with said rectifier;
   a first controllable switching means coupled in series with said rectifier for switching current to said rectifier when said first controllable switching means is in a first state and for switching current away from said rectifier when said first controllable switching means is in a second state, wherein a reverse recovery current originates from said rectifier when said first controllable switching means is in said second state;
   a load coupled in parallel with said capacitive element;
   an reactive impedance circuit coupled in parallel with said rectifier such that a reverse recovery current from said rectifier may be switched to said reactive impedance circuit away from said first controllable switching means; and
   a second controllable switching means coupled to said reactive impedance circuit for switching said reverse recovery current into said reactive impedance circuit away from said first controllable switching means.

2. The switching regulator of claim 1, wherein said reactive impedance circuit is a series circuit including an inductor, a diode and a zener diode.

3. The switching regulator of claim 2, further comprising a second diode coupled between said second controllable switching element and said reactive impedance circuit and a resistor coupled in parallel with said second diode.

4. A switching voltage regulator comprising:
a rectifier;
a capacitive element coupled in series with a first end of said rectifier;
a first controllable switching means coupled in series with said rectifier for switching current to said rectifier when said first controllable switching means is in a first state and for switching current away from said rectifier when said first controllable switching means is in a second state, wherein a reverse recovery current originates from said rectifier when said first controllable switching means is in said second state;
a load coupled in parallel with said capacitive element;
an inductive element having a first end coupled to a second end of said rectifier and to said first controllable switching means such that a reverse recovery current from said second end of said rectifier may be switched to said inductive element and stored in said inductive element;
a second controllable switching means coupled to a second end of said inductive element for switching said reverse recovery current into said first end of said inductive element away from said first controllable switching means; and
a circuit means coupled to said second end of said inductive element and to said load for directing current stored in said inductive element into said load.

5. A switching regulator comprising:
a series circuit including a main inductor, a main diode, and a capacitor;
a first controllable switch coupled to a coupling junction between said main inductor and said main diode;
a second inductor having a first end coupled to said coupling junction;
a second controllable switching circuit coupled to a second end of said inductor; and
a circuit means coupled to said inductive element and to said load for directing current stored in said inductive element into said load. directing current stored in said inductive element into said load.

6. The circuit of claim 5, wherein said circuit means includes a diode coupled to a zener diode, wherein one end of said diode is coupled to a second end of said second inductor and one end of said zener diode is coupled to a coupling junction between said main diode and said capacitor.

* * * * *